United States Patent [19]
Sonokawa et al.

[11] Patent Number: 5,882,398
[45] Date of Patent: Mar. 16, 1999

[54] METHOD OF MANUFACTURING SINGLE CRYSTAL OF SILICON

[75] Inventors: Susumu Sonokawa; Toshiro Hayashi, both of Nishishirakawa, Japan; Atsushi Iwasaki, Vancouver, Wash.; Tomohiko Ohta, Nishishirakawa, Japan

[73] Assignee: Shin-Etsu Handotai Co., Ltd., Tokyo, Japan

[21] Appl. No.: 786,340

[22] Filed: Jan. 23, 1997

[30] Foreign Application Priority Data

Jan. 30, 1996 [JP] Japan .................................. 8-035478

[51] Int. Cl.$^6$ .................................................. C30B 15/22
[52] U.S. Cl. .............................. 117/32; 117/30; 117/917
[58] Field of Search ........................ 117/30, 32, 917

[56] References Cited

U.S. PATENT DOCUMENTS

| 4,592,895 | 6/1986 | Matsutani et al. ............... 117/208 |
| 5,183,965 | 2/1993 | Lawless ............................ 174/15.5 |

FOREIGN PATENT DOCUMENTS

| 0319031 | 6/1989 | European Pat. Off. . |
| 0462741 | 12/1991 | European Pat. Off. . |
| 02204386A | 9/1993 | Japan . |
| 21988966 | 6/1988 | United Kingdom . |

OTHER PUBLICATIONS

Fumio Shimura, "Semiconductor Silicon Crystal Technology", pp. 178–181, 1989.
K. Hoshi et al., "CZ Silicon Crystal Grown in Transverse Magnetic Fields", Extended Abstracts, vol. 80–1(1980), pp. 811–813.
E. M. Hull, "Controlling the Oxygen Concentration of Silicon Crystals by Magnetically Induced Melt Rotation", *IBM Technical Disclosure Bulletin*, vol. 23, No. 7A, Dec. 1980.

*Primary Examiner*—Felisa Hiteshew
*Attorney, Agent, or Firm*—Oliff & Berridge, PLC

[57] ABSTRACT

A single crystal of silicon is manufactured in accordance with the Czochralski method. A magnetic field is applied to a quartz crucible filled with silicon melt. Subsequently, a single crystal of silicon is pulled in a state in which no magnetic field is applied to the crucible, so as to obtain a single crystal of silicon. Therefore, the inner surface of a quartz crucible becomes very unlikely to deteriorate, and when the inner surface deteriorates, the deteriorated inner surface is restored. Accordingly, it is possible to manufacture a single crystal of silicon having a large diameter without generating a dislocation in the crystal. Moreover, even when a single crystal of silicon having a large diameter is manufactured, a larger number of single crystals of silicon can be manufactured from a single quartz crucible, and the pulling apparatus can be operated over a longer period of time using a single quartz crucible, thereby making it possible to manufacture a longer single crystal.

11 Claims, 3 Drawing Sheets

METHOD OF MANUFACTURING SINGLE CRYSTAL OF SILICON

BACKGROUND OF THE INVENTION

1. Field of the Invention

The present invention relates to a method of manufacturing a single crystal of silicon through use of the Czochralski method (CZ method) in which a single crystal of silicon is manufactured using a quartz crucible after a magnetic field is applied to the crucible so as to restore the inner surface of the crucible or to prevent the inner surface of the crucible from deteriorating.

2. Description of the Related Art

When a single crystal of silicon is pulled from silicon melt within a quartz crucible in accordance with the CZ method, the inner surface of the crucible is exposed to the silicon melt, which has a high temperature. As a result, the condition of the inner surface of the crucible changes and deteriorates; i.e., so-called cristobalite, a substance that hardly melts into the silicon melt, separates from the inner surface of the crucible. When such a refractory substance separates from the inner surface of the crucible and adheres to the surface of a single crystal of silicon being pulled, a dislocation is generated in the single crystal.

Especially, in manufacture of a single crystal of silicon having a diameter equal to or greater than 8 inches needed so as to cope with the recent increases in the degree of integration and the degree of accuracy of semiconductor devices, the inner surface of a quartz crucible deteriorates easily, and therefore the problem of dislocation generation is apt to occur. That is, in order to manufacture a single crystal of silicon having a diameter equal to or greater than 8 inches, a quartz crucible having a large diameter equal to or greater than 600 mm must be used. In order to melt a large amount of silicon material within such a large-diameter quartz crucible and to maintain the thus-obtained silicon melt, a high-power graphite heater must be used as a heating element. As a result, the quartz crucible itself is heated to a higher temperature. The higher the temperature to which the quartz crucible is heated, the higher the possibility of occurrence of deterioration of the inner surface, that is in contact with high-temperature silicon melt. Further, in order to pull a single crystal of silicon from a quartz crucible, the temperature of the silicon melt at a position where the crystal is growing (i.e., at the central portion) must be maintained at a temperature that allows the silicon melt to solidify. Therefore, when the quartz crucible has a large diameter as described above, the graphite heater for the crucible must have a large power rating, because the center portion is separated from the graphite heater more than is that in a quartz crucible having a smaller diameter. Consequently, the quartz crucible having a larger diameter is heated to a higher temperature, so its inner surface exposed to silicon melt deteriorates more easily.

The above-mentioned deterioration of the inner surface of a quartz crucible also occurs in the multi-pulling method (see Semiconductor Silicon Crystal Technology, Fumio Shimura, pp. 178–179, 1989) wherein a silicon material is recharged so as to manufacture a plurality of single crystals of silicon from the same crucible; as well as in the Continuous Czochralski (CCZ) method in which a single crystal of silicon is manufactured while a silicon material is being supplied to a crucible. In these methods, the operation hours of the quartz crucible becomes longer, so that the inner surface of the quartz crucible deteriorates, resulting in generation of dislocations in single crystal of silicon. Therefore, in the multi-pulling method, production of a single crystal of silicon becomes impossible to continue, and in the CCZ method, production of a single crystal of silicon must be stopped halfway.

Accordingly, there has been demanded a method of manufacturing a single crystal of silicon that can reduce the possibility of causing deterioration of the inner surface of a quartz crucible or can restore the deteriorated inner surface of the crucible, thereby making it possible to manufacture a single crystal of silicon having a large diameter while preventing generation of dislocation. Further, in relation to the multi-pulling method, it has been demanded to manufacture a larger number of single crystals of silicon from a single quartz crucible, and in relation to the CCZ method, it has been demanded to operate over a longer period of time using a single quartz crucible, thereby making it possible to manufacture a longer single crystal.

SUMMARY OF THE INVENTION

The present invention has been accomplished to solve the above-mentioned problems, and an object of the present invention is to provide an improved method of manufacturing a single crystal of silicon that can reduce the possibility of causing deterioration of the inner surface of a quartz crucible or that can restore the deteriorated inner surface of the crucible, thereby making it possible to manufacture a single crystal of silicon having a large diameter while preventing generation of dislocations.

Another object of the present invention is to provide a method that can manufacture a larger number of single crystals of silicon from a single quartz crucible.

Still another object of the present invention is to provide a method that allows operation over a longer period of time using a single quartz crucible, thereby making it possible to manufacture a longer single crystal.

The inventors of the present invention found that application of a magnetic field to a quartz crucible filled with silicon melt makes deterioration of the inner surface of the quartz crucible very unlikely to occur, and can restore the deteriorated inner surface of the crucible.

The present invention provides an improved method of manufacturing a single crystal of silicon in accordance with the CZ method, wherein a magnetic field is applied to a quartz crucible filled with silicon melt, and a single crystal of silicon is then pulled in a state in which no magnetic field is applied to the crucible, whereby a single crystal of silicon is obtained.

The present invention also provides an improved method of manufacturing a single crystal of silicon in accordance with the CZ method, wherein a magnetic field is applied to a quartz crucible filled with silicon melt, the crucible is rotated while application of the magnetic field is maintained, and a single crystal of silicon is then pulled in a state in which no magnetic field is applied to the crucible, whereby a single crystal of silicon is obtained.

As described above, when a magnetic field is applied to a quartz crucible filled with silicon melt, deterioration of the inner surface of the quartz crucible becomes very unlikely to occur, and the deteriorated inner surface of the crucible can be restored. The detailed mechanism of the above phenomenon is not clear. However, the inventors of the present invention theorize as follows: When a magnetic field is applied to a quartz crucible filled with silicon melt, the convection of silicon melt within the quartz crucible is suppressed by an electromagnetic force. When the quartz crucible is forcibly rotated in such a state, a relative speed difference is produced between a portion of silicon that tends to maintain its original position and the rotating quartz crucible. As a result, the melting speed of the quartz crucible increases, so that it becomes difficult for refractory substance to be produced on the inner surface of the crucible. That is, the inner surface of the quartz crucible is prevented from deteriorating. Also, due to the increased melting speed of the quartz crucible, the refractory substance produced on the inner surface of the quartz crucible does not peel off but melts easily, so that the inner surface of the quartz crucible becomes smooth, i.e., the deteriorated inner surface of the quartz crucible is restored.

In the method of manufacturing a single crystal of silicon according to the present invention, application of a magnetic field is performed according to one of the following three methods:

I) a magnetic field is applied to a quartz crucible before production of a first single crystal of silicon;

II) a magnetic field is applied after production of one or more single crystals of silicon and before further production of single crystals of silicon, and such application of a magnetic field is repeated once or a plurality of times; and III) combination of I) and II).

Method I) prevents the inner surface of the quartz crucible from deteriorating; method II) restores the inner surface of the quartz crucible if it has deteriorated; and method III) prevents the inner surface of the quartz crucible from deteriorating, and restores the inner surface of the quartz crucible if it has deteriorated.

In the present invention, the inner surface of a quartz crucible becomes very unlikely to deteriorate, and when the inner surface deteriorates, the deteriorated inner surface is restored. Therefore, it is possible to manufacture a single crystal of silicon having a large diameter without generating a dislocation in the crystal. Moreover, even when a single crystal of silicon having a large diameter is manufactured, a substantially larger number of single crystals of silicon can be manufactured from a single quartz crucible, and the pulling apparatus can be operated over a longer period of time using a single quartz crucible, thereby making it possible to manufacture a longer single crystal.

DESCRIPTION OF THE PREFERRED EMBODIMENT

An embodiment of the present invention will now be described in detail with reference to the accompanying drawings.

Figure 1:
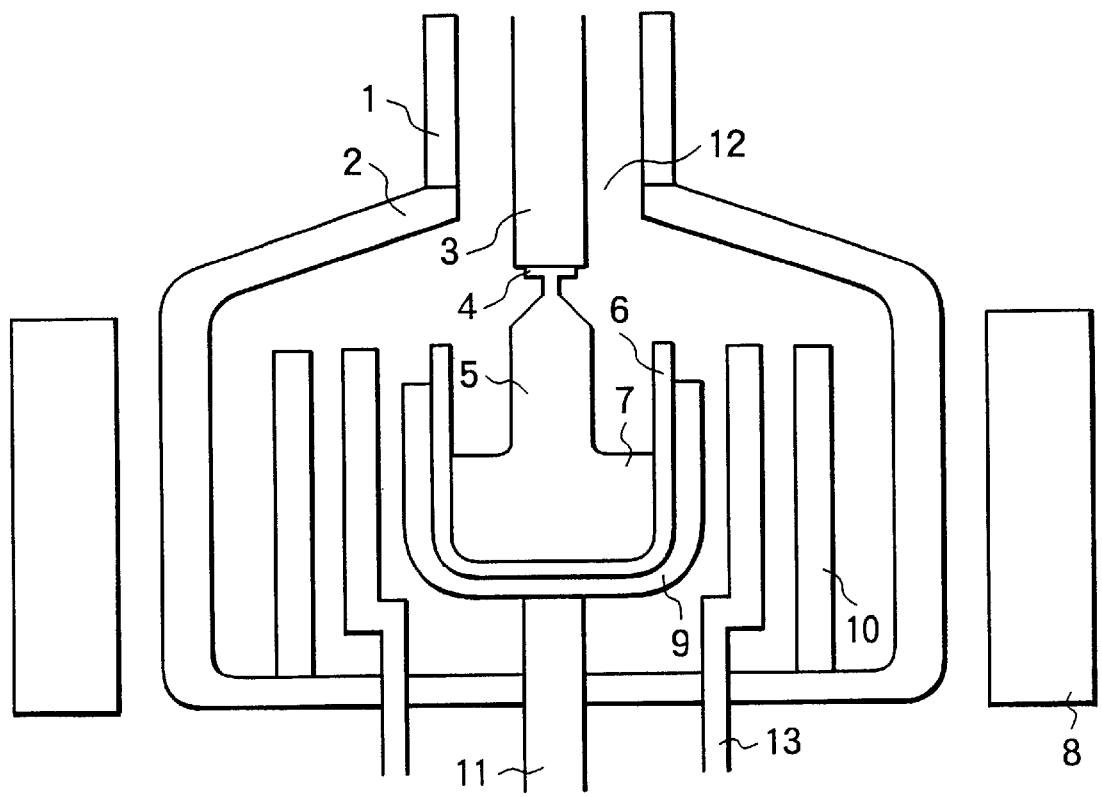
FIG. 1 is a vertical cross-sectional view showing an example of an apparatus which is used in a method of manufacturing a single crystal of silicon in accordance with the CZ method of the present invention.

FIG. 1 is a vertical cross-sectional view showing an example of an apparatus which is used in a method of manufacturing a single crystal of silicon in accordance with the CZ method of the present invention.

As shown in FIG. 1, a quartz crucible 6 supported by a graphite susceptor 9 is disposed at the substantial center of a pulling chamber (metal chamber) 2. The graphite susceptor 9 is surrounded by a graphite heater 13, which is in turn surrounded by a heat insulating cylinder 10. The bottom of the susceptor 9 is supported at its center by a support shaft 11 that is rotatable and vertically movable. Provided at the center of the ceiling of the pulling chamber 2 is an opening 12 to which a sub-chamber 1 is connected. A pulling member 3 such as a shaft or a wire that is rotatable and vertically movable is passed through the sub-chamber 1 so that the pulling member 3 extends downward. On the outer side of the pulling chamber 2 is disposed a magnet 8 that applies a magnetic field to the quartz crucible 6.

When a single crystal of silicon having a large diameter is manufactured, the amount of silicon melt 7 must be increased; therefore the diameter of the quartz crucible 6 that accommodates the silicon melt 7 must be increased accordingly.

When a single crystal of silicon is manufactured in accordance with the CCZ method, a single crystal is pulled while polycrystalline silicon is supplied as a raw material. Therefore, it is necessary to further provide a supply pipe (not illustrated) for supplying polycrystalline silicon as a raw material.

The CZ method is generally performed as follows:

1) Polycrystalline silicon is charged as a raw material into the quartz crucible 6 and is then heated by the graphite heater 13, whereby the silicon melt 7 is obtained.

2) Subsequently, the pulling member 3 that holds a seed crystal 4 is moved downward so as to immerse the seed crystal 4 into the silicon melt 7.

3) Subsequently, the pulling member 3 is rotated and raised while the support shaft 11 is rotated, whereby a single crystal 5 is grown to obtain a single crystal of silicon.

The method of manufacturing a single crystal of silicon according to the present invention is performed according to one of the following techniques:

i) after the above-described step 1), a magnetic field is applied to the quartz crucible so as to prevent deterioration of the inner surface of the quartz crucible, and steps 2) and 3) are then performed without application of a magnetic field;

ii) after the above-described steps 1)–3) are performed once without application of a magnetic field, steps 1)–3) are performed once or a plurality of times without application of a magnetic field wherein, after step 1) is performed as a recharge operation, a magnetic field is applied to the quartz crucible so as to restore the deteriorated inner surface of the quartz crucible, and steps 2) and 3) are then performed (multi-pulling method) without application of a magnetic field; or iii) after the above-described step 1), a magnetic field is applied to the quartz crucible so as to prevent deterioration of the inner surface of the quartz crucible, and steps 2) and 3) are then performed without application of a magnetic field; and steps 1)–3) are performed once or a plurality of times wherein, after step 1) is performed as a recharge operation, a magnetic field is applied to the quartz crucible so as to restore the deteriorated inner surface of the quartz crucible, and steps 2) and 3) are then performed without application of a magnetic field (multi-pulling method).

Next, the present invention will be described by way of example.

Example 1

The speed at which quartz of the crucible melted into silicon melt was examined for the case where a magnetic field was applied to a quartz crucible and for the case where no magnetic field was applied to the quartz crucible. The direction of a magnetic field was horizontal to the axis along which a crystal is grown. The strength of the magnetic field (MF) was set such that the strength of the magnetic field reached a maximum value at any position along the center line (the axis along which a crystal is grown) and the maximum value was 4,000 gauss (0.4 T). The results of the test are shown in FIG. 2.

Figure 2:
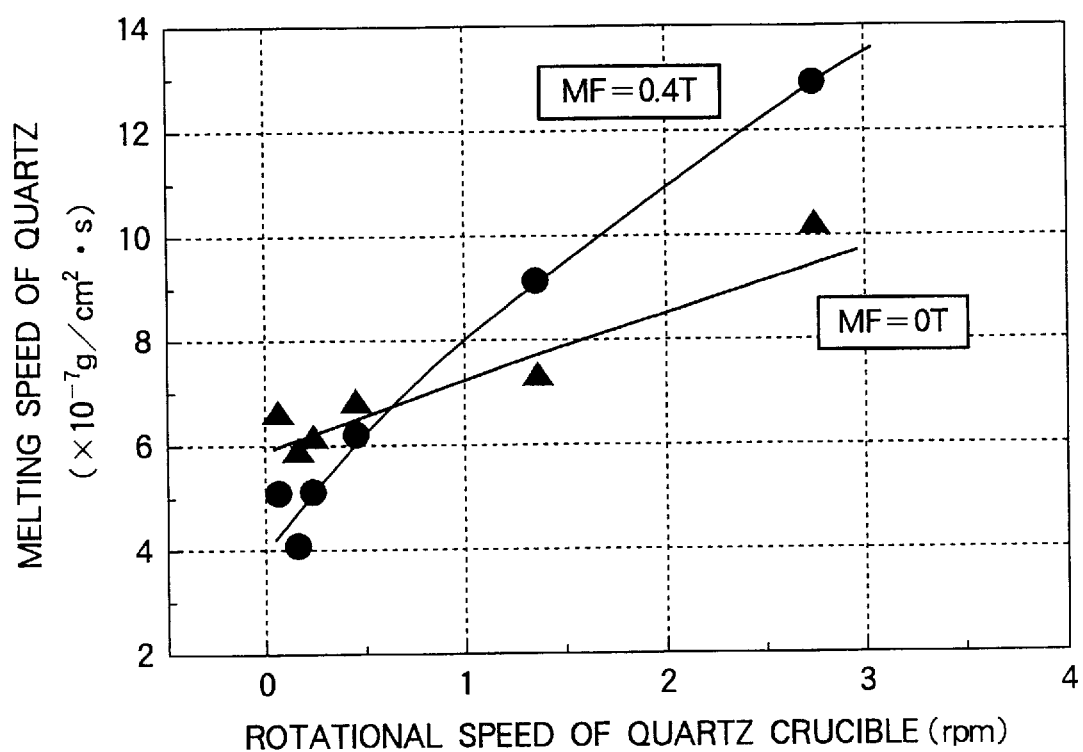
FIG. 2 is a graph showing the relationship between the rotational speed of a quartz crucible and the speed at which quartz of the crucible melts into silicon melt for the case where a magnetic field was applied to the quartz crucible and for the case where no magnetic field was applied to the quartz crucible.

FIG. 2 shows the relationship between the rotational speed of a quartz crucible and the speed at which quartz of the crucible melted into silicon melt for the case where a magnetic field was applied to the quartz crucible and for the case where no magnetic field was applied to the quartz crucible. From FIG. 2, it is understood that the melting speed of quartz in the case where a magnetic field was applied (MF=0.4 T) is greater than the melting speed in the case where no magnetic field was applied (MF=0 T), and that the difference in the melting speed of quartz between the two cases increases as the rotational speed of the crucible increases.

Next, the conditions of the inner surfaces of the quartz crucibles were examined for the above-described two cases.

Figure 3A:
FIG. 3A is a copy of a photograph showing the condition of the inner surface of a quartz crucible when a magnetic field was applied to the quartz crucible.
Figure 3B:
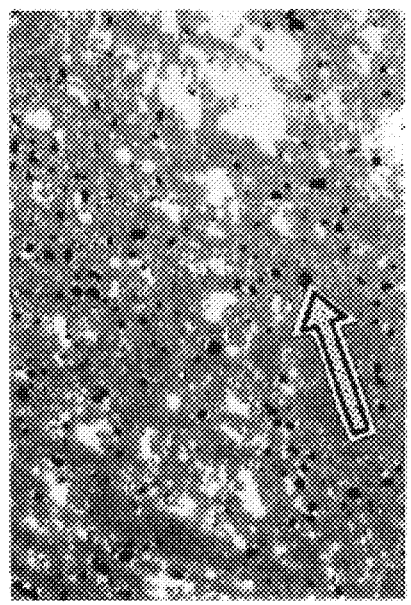
FIG. 3B is a copy of a photograph showing the condition of the inner surface of a quartz crucible when no magnetic field was applied to the quartz crucible.

FIG. 3A shows the condition of the inner surface of a quartz crucible when a magnetic field was applied to the quartz crucible, and FIG. 3B shows the condition of the inner surface of a quartz crucible when no magnetic field was applied to the quartz crucible.

As is understood from FIGS. 3A and 3B, when a magnetic field was applied, the inner surface of the quartz crucible was maintained smooth and did not deteriorate, and when no magnetic field was applied, many pieces of cristobalite were generated on the inner surface of the quartz crucible, resulting in deterioration of the quartz crucible.

Example 2

(example of the above-described method ii) in accordance with the multi-pulling method):

Ten quartz crucibles having an outer diameter of about 610 mm were prepared. Each quartz crucible was used to manufacture a single crystal of silicon having a diameter of about 200 mm while no magnetic field was applied. Subsequently, polycrystalline silicon was charged into the quartz crucible for recharge and was heated and melted so as to increase the amount of silicon melt to the original quantity.

Subsequently, five of the ten quartz crucibles filled with silicon melt were selected and a horizontal magnetic field was applied to each of the selected crucibles such that the strength of the magnetic field reached a maximum value at any position along the center line (the axis along which a crystal is grown) and the maximum value was 4,000 gauss, thereby suppressing the convection of silicon melt within the quartz crucible. The quartz crucible was then rotated at 1 rpm for 120 minutes, while application of the magnetic field was maintained, so as to restore the deteriorated inner surface of the crucible. Subsequently, application of the magnetic field was stopped, and a single crystal of silicon was grown in a state in which no magnetic field was applied. In this way, a single crystal of silicon was obtained. The steps of recharge, application of a magnetic field, and growth of a single crystal of silicon were repeated so as to manufacture six crystal rods of silicon from each quartz crucible.

With regard to the remaining five quartz crucibles, each crucible was rotated at 1 rpm for 120 minutes, while no magnetic field was applied thereto; i.e., without restoration of the deteriorated inner surface of the crucible. Subsequently, a single crystal of silicon was grown.

When a magnetic field was applied to the quartz crucible so as to restore the deteriorated inner surface of the crucible, up to six of the six crystal bars manufactured from the same quartz crucible were dislocation-free single crystals.

When two crystal bars were successively manufactured from each quartz crucible (i.e., a first set of five bars were first manufactured in total and a second set of five bars were subsequently manufactured in total) in a state in which no magnetic field was applied to the quartz crucible (i.e., when the deteriorated inner surface of the crucible was not restored), dislocations were generated in four of five crystal bars in the second set.

The results of the above-described test are shown in Table 1.

TABLE 1

| | Restoration of the inner surface of the crucible | |
|---|---|---|
| | Performed | Not performed |
| Number of crucibles used | 5 | 5 |
| Number of crystal bars manufactured from each crucible | 6 | 2 |
| Ratio of dislocation-free crystal bars to all the crystal bars in the second and subsequent pulling operations (%) | 88 | 20 |
| Yield of dislocation-free crystals[1] (%) | 76 | 55 |

[1] Weight ratio of dislocation-free straight body part of crystal bars to charged polycrystalline silicon raw material From these results, it is understood that when the method of the present invention is used, a considerable large number of dislocation-free single crystals having a large diameter can be manufactured from a single crucible in accordance with the multi-pulling method.

Moreover, after completion of manufacture of crystal bars, the inner surface of a crucible which had been exposed to a magnetic field and the inner surface of a crucible which had not been exposed to a magnetic field were examined. The inner surface of the crucible which had been exposed to a magnetic field was smooth and had not deteriorated. In contrast, the inner surface of the crucible which had not been exposed to a magnetic field was in the condition in which refractory substances on the inner surface would peel off and be mixed into the silicon melt.

Example 3

(example of the above-described method i) in accordance with the CCZ method)

A quartz crucible having an outer diameter of about 610 mm was filled with polycrystalline silicon, which was then heated and melted to obtain silicon melt. A horizontal magnetic field was applied to the crucible such that the strength of the magnetic field reached a maximum value at any position along the center line (the axis along which a crystal is grown) and the maximum value was 4,000 gauss, thereby suppressing the convection of silicon melt within the quartz crucible. The quartz crucible was then rotated at 1 rpm for 120 minutes, while application of the magnetic field was maintained, so as to provide processing for preventing deterioration of the inner surface of the crucible.

Subsequently, a single crystal of silicon having a diameter of about 200 mm was manufactured in accordance with the CCZ method in a state in which no magnetic field was applied to the crucible. The operation period was 250 hours.

No dislocation was produced in the single crystal of silicon until the operation was completed.

This result shows that when the method of the present invention is used, deterioration of the inner surface of the quartz crucible becomes very unlikely to occur. Accordingly, even when a single crystal of silicon is manufactured in accordance with the CCZ method, the pulling operation can be performed for a very long time.

The present invention is not limited to the above-described embodiment. The above-described embodiment is a mere example, and those having the substantially same structure as that described in the appended claims and providing the similar action and effects are included in the scope of the present invention.

For example, although a horizontal magnetic field is applied to a crucible in the above-described embodiment, the present invention is not limited thereto, and the present invention can be applied to the case where a vertical magnetic field is applied to a crucible, and the case where a cusp magnetic field is applied to a crucible.

What is claimed is:

1. A method of manufacturing a single crystal of silicon in accordance with the Czochralski method, comprising the steps of:
   a) applying a magnetic field to a quartz crucible containing a silicon melt; and
   b) pulling a single crystal of silicon from the silicon melt while no magnetic field is applied to the crucible, so as to obtain a single crystal of silicon.

2. A method of manufacturing a single crystal of silicon according to claim 1, wherein the magnetic field is applied to the quartz crucible before any single crystal is pulled from the silicon melt.

3. A method of manufacturing a single crystal of silicon according to claim 2, further comprising the steps of:
   c) performing step (a) after performing step (b) at least once; and
   d) subsequent to step (c) repeating step (b).

4. A method of manufacturing a single crystal of silicon according to claim 3, further comprising performing steps (c) and (d) a plurality of times.

5. A method of manufacturing a single crystal of silicon according to claim 1, further comprising at least once performing the steps of:
   c) performing step (a) after performing step (b) at least once; and
   d) subsequent to step (c) repeating step (b).

6. A method of manufacturing a single crystal of silicon according to claim 5, further comprising performing steps (c) and (d) a plurality of times.

7. A method of manufacturing a single crystal of silicon according to claim 1, wherein step (a) is performed subsequent to performing step (b).

8. A method of manufacturing a single crystal of silicon according to claim 1, wherein step (a) is performed prior to performing step (b) subsequent to performing step (b).

9. A method of manufacturing a single crystal of silicon in accordance with the Czochralski method, comprising the steps of:
   a) applying a magnetic field to a quartz crucible containing a silicon melt;
   a') rotating the crucible while application of the magnetic field is maintained; and
   b) pulling a single crystal of silicon from the silicon melt while no magnetic field is applied to the crucible, so as to obtain as single crystal of silicon.

10. A method of manufacturing a single crystal of silicon according to claim 9, further comprising at least once performing the steps of:
    c) performing step (a) after performing step (b) at least once; and
    d) subsequent to step (c) repeating step (b).

11. A method of manufacturing a single crystal of silicon according to claim 10, further comprising performing steps (c) and (d) a plurality of times.

* * * * *